(12) United States Patent
Kobayashi et al.

(10) Patent No.: US 10,056,277 B2
(45) Date of Patent: Aug. 21, 2018

(54) POLISHING METHOD

(71) Applicant: EBARA CORPORATION, Tokyo (JP)

(72) Inventors: Yoichi Kobayashi, Tokyo (JP); Yoichi Shiokawa, Tokyo (JP); Katsuhide Watanabe, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 94 days.

(21) Appl. No.: 15/357,706

(22) Filed: Nov. 21, 2016

(65) Prior Publication Data

US 2017/0148655 A1 May 25, 2017

(30) Foreign Application Priority Data

Nov. 24, 2015 (JP) .................................. 2015-229002

(51) Int. Cl.
| | |
|---|---|
| B24B 37/00 | (2012.01) |
| H01L 21/67 | (2006.01) |
| H01L 21/3105 | (2006.01) |
| H01L 21/66 | (2006.01) |
| B24B 37/013 | (2012.01) |
| B24B 37/10 | (2012.01) |
| B24B 37/20 | (2012.01) |
| B24B 37/32 | (2012.01) |
| B24B 49/10 | (2006.01) |
| B24B 49/12 | (2006.01) |

(52) U.S. Cl.
CPC ...... *H01L 21/67253* (2013.01); *B24B 37/013* (2013.01); *B24B 37/105* (2013.01); *B24B 37/205* (2013.01); *B24B 37/32* (2013.01); *B24B 49/105* (2013.01); *B24B 49/12* (2013.01); *H01L 21/31053* (2013.01); *H01L 21/67092* (2013.01); *H01L 22/26* (2013.01)

(58) Field of Classification Search
CPC ... B24B 37/013; B24B 37/105; B24B 37/205; B24B 37/32; B24B 49/105; H01L 21/31053; H01L 21/67092; H01L 22/26
USPC .......................................................... 451/8
See application file for complete search history.

(56) References Cited

U.S. PATENT DOCUMENTS

| | | | | |
|---|---|---|---|---|
| 5,759,918 A | * | 6/1998 | Hoshizaki | ............... B24B 7/241 438/692 |
| 6,491,569 B2 | * | 12/2002 | Bibby, Jr. | ............. B24B 37/013 451/5 |

(Continued)

FOREIGN PATENT DOCUMENTS

JP 2012-028554 A 2/2012

*Primary Examiner* — George Nguyen
(74) *Attorney, Agent, or Firm* — Baker & Hostetler LLP

(57) ABSTRACT

A polishing method capable of obtaining a stable film thickness without being affected by a difference in measurement position is disclosed. The polishing method includes: rotating a polishing table that supports a polishing pad; pressing the surface of the wafer against the polishing pad; obtaining a plurality of film-thickness signals from a film thickness sensor during a latest predetermined number of revolutions of the polishing pad, the film thickness sensor being installed in the polishing table; determining a plurality of measured film thicknesses from the plurality of film-thickness signals; determining an estimated film thickness at a topmost portion of the raised portion based on the plurality of measured film thicknesses; and monitoring polishing of the wafer based on the estimated film thickness at the topmost portion of the raised portion.

10 Claims, 18 Drawing Sheets

(56) References Cited

U.S. PATENT DOCUMENTS

| | | | | |
|---|---|---|---|---|
| 6,562,185 | B2* | 5/2003 | Avanzino | B24B 37/015 156/345.13 |
| 7,144,297 | B2* | 12/2006 | Lin | G05B 23/0297 451/5 |
| 8,582,122 | B2* | 11/2013 | Kobayashi | B24B 37/013 356/445 |
| 8,687,197 | B2* | 4/2014 | Kimba | B24B 37/013 356/445 |
| 8,932,106 | B2* | 1/2015 | Fukushima | B24B 37/015 451/288 |
| 2005/0075052 | A1* | 4/2005 | Kim | B24B 37/044 451/41 |
| 2006/0166606 | A1* | 7/2006 | Kobayashi | B24B 49/12 451/6 |
| 2011/0081829 | A1* | 4/2011 | Ohta | B24B 37/013 451/6 |
| 2012/0220195 | A1* | 8/2012 | Gawase | B24B 37/015 451/7 |

* cited by examiner

NUMBER OF REVOLUTIONS OF TABLE

NUMBER OF REVOLUTIONS OF TABLE

NUMBER OF REVOLUTIONS OF TABLE

NUMBER OF
REVOLUTIONS OF TABLE

NUMBER OF
REVOLUTIONS OF TABLE

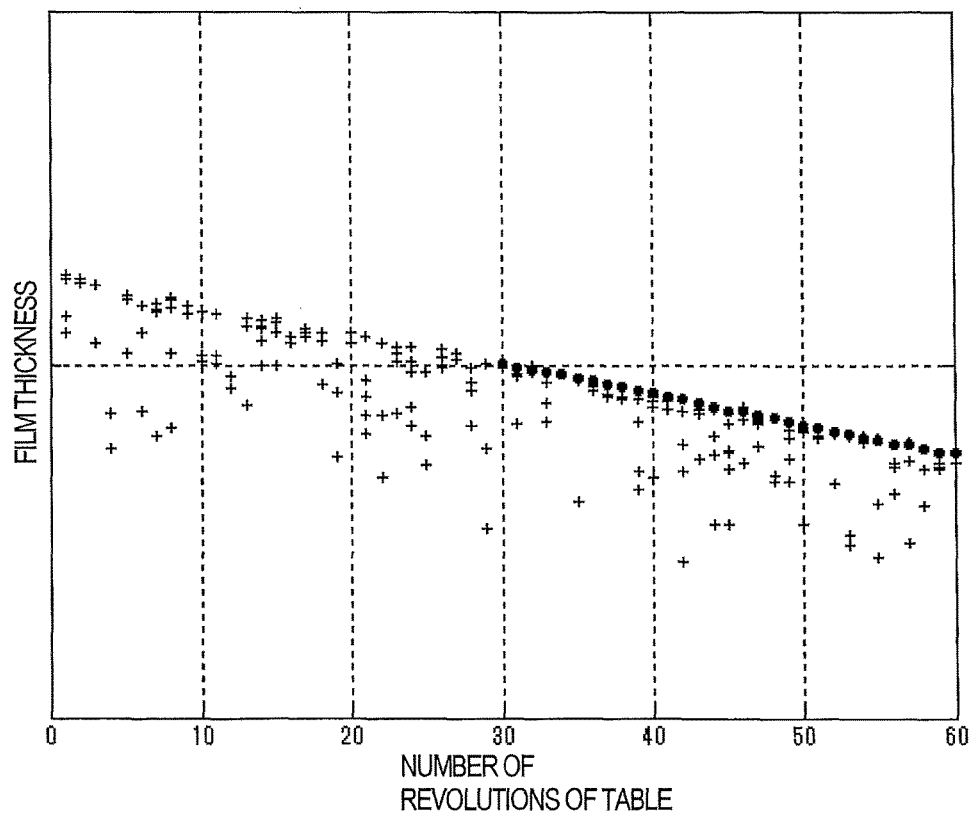

POLISHING METHOD

CROSS REFERENCE TO RELATED APPLICATION

This document claims priority to Japanese Patent Application Number 2015-229002 filed Nov. 24, 2015, the entire contents of which are hereby incorporated by reference.

BACKGROUND

A polishing apparatus for polishing a wafer often uses a spectroscopic monitoring system for the purpose of mainly monitoring the progress of polishing of a dielectric layer (transparent layer), or uses an eddy-current type monitoring system for the purpose of mainly monitoring the progress of polishing of a conductive layer (metal film). In the spectroscopic monitoring system, a light-emitting fiber and a light-receiving fiber are connected to a light source and a spectrometer, respectively, which are mounted in a polishing table. The front ends of these fibers function as a measuring section constituting a light-emitting section and a light-receiving section. The measuring section (i.e., the light-emitting section and the light-receiving section) is disposed at such a position as to scan a wafer surface each time the polishing table makes one revolution. In the case of the eddy-current type monitor, an exciting coil, a detection coil, etc. are provided as a measuring section.

In this type of monitoring system having the measuring section disposed in the polishing table, it is difficult to precisely control a measurement position on a wafer surface during polishing. Generally, a polishing head is structured such that a wafer is allowed to move slightly inside a retaining ring of the polishing head. With this structure, the wafer may be displaced radially relative to the center of the polishing head, or may gradually rotate over time relative to the polishing head. Accordingly, it is difficult to successively measure a predetermined position on the surface of the wafer. As a result, measurement data can vary greatly depending on which portion of a feature formed on the wafer surface is measured.

FIG. 18A is a graph showing a change in measured film thickness at an initial stage of polishing, and FIG. 18B is a graph showing a change in measured film thickness at an intermediate stage of polishing. The measured film thicknesses in the graphs are those in a measurement area at a distance of about 120 mm from the center of a 300-mm wafer. The wafer as a measurement object is a wafer having a plurality of raised portions on the surface, for example, a wafer having a cell array composed of a number of cells (memory cells) arranged in a matrix pattern.

A spectroscopic monitoring system having a xenon flash light source was used to measure a thickness of a film of the wafer. Measurement data, which was considered to represent film thicknesses of the raised portion, was extracted. Referring to FIG. 18A, the variation in the measured film thickness is small, and the measured film thickness decreases approximately linearly with the number of revolutions of the polishing table, i.e. with the elapse of polishing time. Referring to FIG. 18B, in contrast, while the measured film thickness decreases with the polishing time, the variation in the measured film thickness is large, thus making it difficult to control a film-thickness profile and detect a polishing end point based on each one of the measured film thicknesses.

FIG. 19A is a diagram showing a profile (i.e., a cross-sectional shape) of a raised portion at the initial stage of polishing, corresponding to FIG. 18A, and FIG. 19B is a diagram showing a profile (i.e., a cross-sectional shape) of the raised portion at the intermediate stage of polishing, corresponding to FIG. 18B. The profile shown in FIG. 19A is a profile of a raised portion 106 before polishing of the wafer and having a rectangular cross section. The profile shown in FIG. 19B is a profile of the raised portion 106 obtained when polishing of the wafer is once stopped after the wafer has been polished for a certain period of time. Trenches 110 are formed on both sides of the raised portion 106. The raised portion 106 is, for example, the above-described cell (memory cell).

As can be seen in FIGS. 19A and 19B, the cross-sectional shape of the raised portion, which is rectangular before polishing, becomes rounded at its corners with the progress of polishing. Therefore, the measured film thickness varies depending on the measurement position of the measuring section of the spectroscopic monitoring system. For example, in FIG. 19A, the film thickness in the central portion of the raised portion 106 is equal to the film thickness in the edge portion of the raised portion 106, while in FIG. 19B, the film thickness at a topmost portion 106a located at the center of the raised portion 106 differs from the film thickness in an edge portion 106b of the raised portion 106. As can be seen in FIG. 19B, the raised portion 106 has the maximum film thickness at its topmost portion 106a and the minimum film thickness in its edge portion 106b. Accordingly, the measured film thickness varies depending on the difference in the measurement position, thus making it impossible to accurately detect a polished state.

SUMMARY OF THE INVENTION

According to an embodiment, there is provided a polishing method capable of obtaining a stable film thickness without being affected by a difference in measurement position.

Embodiments, which will be described below, relate to a method of polishing a surface of a wafer, and more particularly to a method of polishing a wafer having a raised portion formed on a surface thereof.

In an embodiment, there is provided a method of polishing a wafer having a raised portion formed on a surface of the wafer, comprising: rotating a polishing table that supports a polishing pad; pressing the surface of the wafer against the polishing pad; obtaining a plurality of film-thickness signals from a film thickness sensor during a latest predetermined number of revolutions of the polishing pad, the film thickness sensor being installed in the polishing table; determining a plurality of measured film thicknesses from the plurality of film-thickness signals; determining an estimated film thickness at a topmost portion of the raised portion based on the plurality of measured film thicknesses; and monitoring polishing of the wafer based on the estimated film thickness at the topmost portion of the raised portion.

In an embodiment, determining the estimated film thickness at the topmost portion of the raised portion comprises: performing a regression analysis on a plurality of data points to determine a regression line, the plurality of data points being specified by the latest plurality of measured film thicknesses and corresponding numbers of revolutions of the polishing table; and substituting a current number of revolutions of the polishing table into a function that expresses the regression line to determine the estimated film thickness.

In an embodiment, determining the estimated film thickness at the topmost portion of the raised portion further comprises: excluding at least one of data points which lie below the regression line from the plurality of data points after determining of the regression line; and performing a regression analysis on the plurality of data points, from which the at least one data point has been excluded, to determine a new regression line, wherein the estimated film thickness is determined by substituting the current number of revolutions of the polishing table into a function that expresses the new regression line.

In an embodiment, determining the estimated film thickness at the topmost portion of the raised portion comprises: performing a regression analysis on a plurality of data points to determine a regression line, the plurality of data points being specified by the latest plurality of measured film thicknesses and corresponding numbers of revolutions of the polishing table; and adding a predetermined offset value to a value obtained by substituting a current number of revolutions of the polishing table into a function that expresses the regression line to determine the estimated film thickness.

In an embodiment, determining the estimated film thickness at the topmost portion of the raised portion comprises: producing a probability distribution of the latest plurality of measured film thicknesses; and determining the estimated film thickness at which a probability of smaller measured film thicknesses is a predetermined value.

In an embodiment, the film thickness sensor is an optical sensor having a pulsed light source.

In an embodiment, the film thickness sensor is an eddy-current sensor.

In an embodiment, the method further comprises determining an end point of polishing of the wafer based on the estimated film thickness at the topmost portion of the raised portion.

In an embodiment, the method further comprises changing a polishing condition for the wafer based on the estimated film thickness at the topmost portion of the raised portion.

In an embodiment, the method further comprises: before the film thickness sensor next obtains film-thickness signals, predicting a film thickness at the topmost portion of the raised portion based on a current value and a previous value of the estimated film thickness at the topmost portion of the raised portion; and determining an end point of polishing of the wafer based on the predicted film thickness.

According to the above-described embodiments, even if there is a variation in the latest plurality of measured film thicknesses, an estimated film thickness at the topmost portion of the raised portion, i.e. an estimated value of the locally-maximum film thickness, can be determined by performing, for example, a regression analysis or a statistical analysis of the measured film thicknesses. This makes it possible to obtain a film thickness which decreases with polishing time.

BRIEF DESCRIPTION OF THE DRAWINGS

FIG. 8 is a graph showing estimated film thicknesses at a topmost portion of a raised portion, i.e., estimated values of a locally-maximum film thickness, determined by the method shown in FIG. 3;

DESCRIPTION OF EMBODIMENTS

Figure 1:
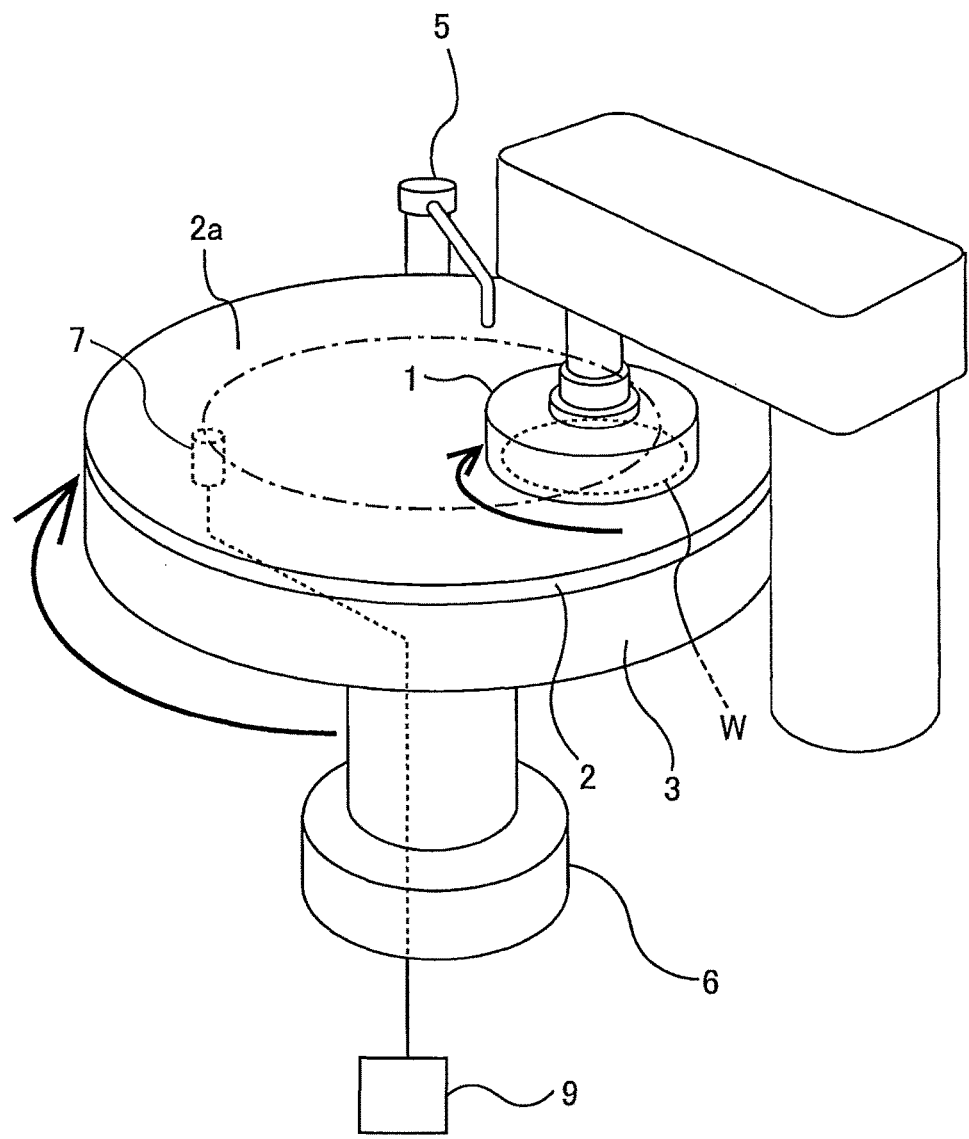
FIG. 1 is a schematic view of a polishing apparatus which can perform a polishing method according to an embodiment.

Embodiments will be described below. FIG. 1 is a schematic view of a polishing apparatus which can perform a polishing method according to an embodiment. As shown in FIG. 1, the polishing apparatus includes a polishing table 3 for supporting a polishing pad 2, a polishing head 1 for pressing a wafer W against the polishing pad 2, a table motor 6 for rotating the polishing table 3, and a polishing-liquid supply nozzle 5 for supplying a polishing liquid (e.g., slurry) onto the polishing pad 2. The polishing pad 2 has a surface that constitutes a polishing surface 2a for polishing the wafer W. The polishing table 3 is coupled to the table motor 6 so that the polishing table 3 and the polishing pad 2 are rotated by the table motor 6.

A film thickness sensor 7 is disposed in the polishing table 3. The film thickness sensor 7 rotates together with the polishing table 3 and the polishing pad 2. A position of the film thickness sensor 7 is such that the film thickness sensor 7 sweeps across a surface of the wafer W on the polishing pad 2 each time the polishing table 3 and the polishing pad 2 make one revolution. The film thickness sensor 7 is coupled to a processor 9 so that a film-thickness signal, which is an output signal of the film thickness sensor 7, is sent to the processor 9. The processor 9 is configured to estimate a film thickness of the wafer W based on the film-thickness signal.

The film thickness sensor 7 is a senor which generates the film-thickness signal that varies in accordance with the film thickness of the wafer W. For example, the film thickness sensor 7 comprises an optical sensor or an eddy-current sensor. The optical sensor is configured to emit light onto the surface of the wafer W, measure intensities of reflected light from the wafer W at respective wavelengths, and output the intensities, associated with the wavelengths respectively, of the reflected light. The intensities, associated with the respective wavelengths of the reflected light, constitute the film-thickness signal that varies in accordance with the film thickness of the wafer W. The eddy-current sensor is configured to induce an eddy current in a conductive film formed on a surface of a wafer, and output the film-thickness signal that varies in accordance with an impedance of an electric circuit containing the conductive film and coils of the eddy-current sensor.

Figure 2:
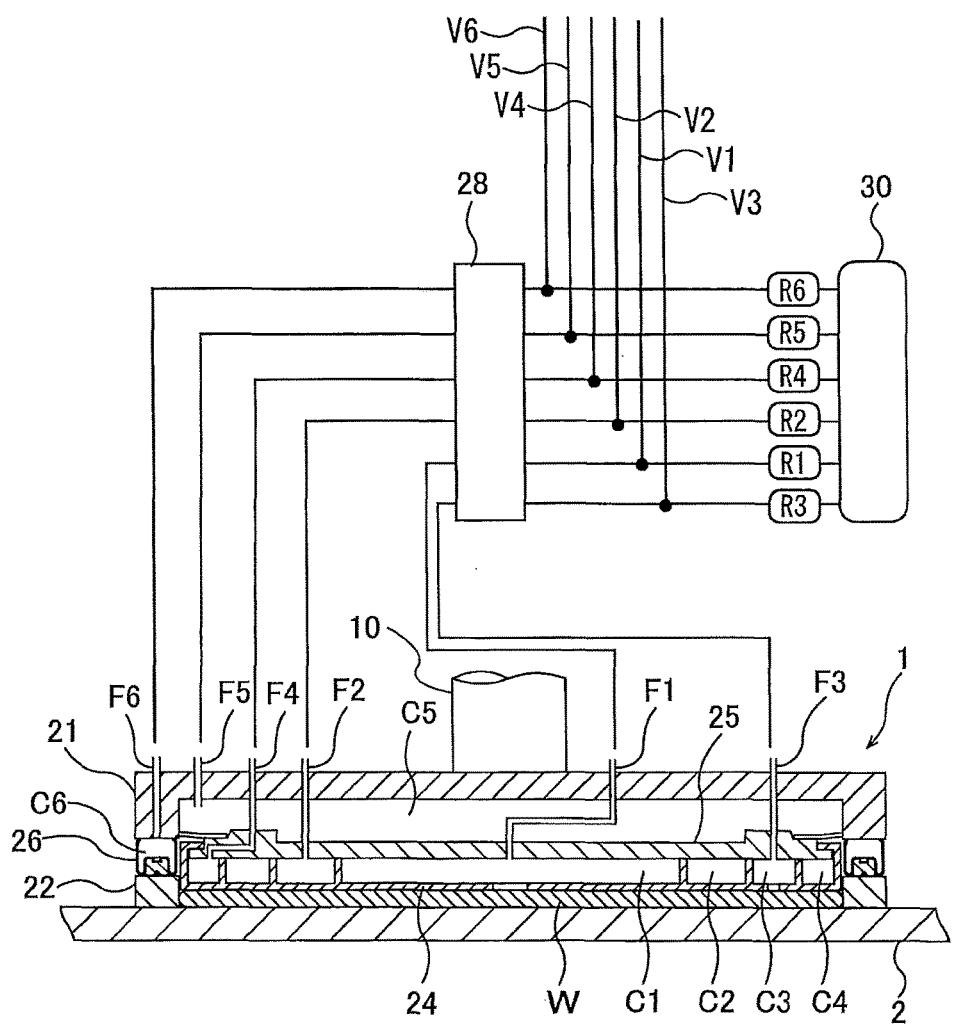
FIG. 2 is a cross-sectional view of a polishing head shown in FIG. 1.

FIG. 2 is a cross-sectional view of the polishing head 1 shown in FIG. 1. The polishing head 1 is configured to be able to apply different pressing forces to a plurality of zones of the wafer W. The polishing head 1 includes a head body 21 coupled to a head shaft 10, and a retaining ring 22 disposed below the head body 21.

A flexible membrane 24 to be brought into contact with an upper surface (i.e., a surface at an opposite side from the surface to be polished) of wafer W and a membrane holder 25 that holds the membrane 24 are disposed below the head body 21. Four pressure chambers C1, C2, C3, and C4 are provided between the membrane 24 and the membrane holder 25. The pressure chambers C1, C2, C3, and C4 are formed by the membrane 24 and the membrane holder 25. The central pressure chamber C1 has a circular shape, and the other pressure chambers C2, C3, and C4 have an annular shape. These pressure chambers C1, C2, C3, and C4 are in a concentric arrangement. The polishing head 1 in this embodiment includes the four pressure chambers C1 to C4, while the polishing head 1 may include less than four pressure chambers or more than four pressure chambers.

Pressurized gas, such as pressurized air, is supplied through gas delivery lines F1, F2, F3, and F4 into the pressure chambers C1, C2, C3, and C4, respectively, by a gas supply source 30. Vacuum lines V1, V2, V3, and V4 are coupled to the gas delivery lines F1, F2, F3, and F4, respectively, so that negative pressure can be produced in the pressure chambers C1, C2, C3, and C4 by the vacuum lines V1, V2, V3, and V4. The pressures in the pressure chambers C1, C2, C3, and C4 can be changed independently to thereby independently adjust the pressing forces against corresponding four zones of the wafer W: a central zone; an inner intermediate zone; an outer intermediate zone; and a peripheral zone.

A pressure chamber C5 is formed between the membrane holder 25 and the head body 21. The pressurized gas is supplied through a gas delivery line F5 into the pressure chamber C5 by the gas supply source 30. Further, a vacuum line V5 is coupled to the gas delivery line F5, so that negative pressure can be produced in the pressure chamber C5 by the vacuum line V5. With these operations, entireties of the membrane holder 25 and the membrane 24 can move up and down.

The retaining ring 22 is arranged around the peripheral portion of the wafer W so as to prevent the wafer W from coming off the polishing head 1 during polishing. The membrane 24 has an opening in a portion that forms the pressure chamber C3, so that the wafer W can be held on the polishing head 1 by vacuum suction when a vacuum is produced in the pressure chamber C3. Further, the wafer W can be released from the polishing head 1 by supplying nitrogen gas or clean air into the pressure chamber C3.

An annular rolling diaphragm 26 is provided between the head body 21 and the retaining ring 22. A pressure chamber C6 is formed in this rolling diaphragm 26, and is in communication with the gas supply source 30 through a gas delivery line F6. The gas supply source 30 supplies the pressurized gas into the pressure chamber C6, so that the rolling diaphragm 26 presses the retaining ring 22 against the polishing pad 2. Further, a vacuum line V6 is coupled to the gas delivery line F6 so that negative pressure can be produced in the pressure chamber C6 by the vacuum line V6. When a vacuum is produced in the pressure chamber C6, the entirety of the retaining ring 22 is elevated.

The gas delivery lines F1, F2, F3, F4, F5, and F6, communicating with the pressure chambers C1, C2, C3, C4, C5, and C6, respectively, are provided with pressure regulators R1, R2, R3, R4, R5, and R6, respectively. The pressurized gas from the gas supply source 30 is supplied through the pressure regulators R1 to R6 into the pressure chambers C1 to C6. These pressure regulators R1 to R6 are coupled to the pressure chambers C1 to C6 via the gas delivery lines F1 to F6, which extend from the pressure chambers C1 to C6 via a rotary joint 28 to the gas supply source 30.

The pressure regulators R1 to R6 are configured to regulate the pressure in the pressure chambers C1 to C6 by regulating the pressure of the pressurized gas supplied from the gas supply source 30. The pressure regulators R1 to R6 are coupled to the processor 9. The pressure chambers C1 to C6 are further coupled to vent valves (not shown), respectively, so that the pressure chambers C1 to C6 can be ventilated to the atmosphere.

The processor 9 is configured to establish target pressure values for the pressure chambers C1 to C6 and manipulate the pressure regulators R1 to R6 such that the pressures in the pressure chambers C1 to C6 are maintained at the corresponding target pressure values. In particular, the processor 9 estimates the film thickness of the wafer W based on the film-thickness signal from the film thickness sensor 7, determines the target pressure values for the pressure chambers C1 to C4 based on the estimated film thickness, and manipulates the pressure regulators R1 to R4 such that the pressures in the pressure chambers C1 to C4 are maintained at the corresponding target pressure values. For example, the processor 9 decreases the pressure in the pressure chamber corresponding to a wafer zone having a smaller estimated film thickness, and increases the pressure in the pressure chamber corresponding to a wafer zone having a larger estimated film thickness.

The wafer W is polished in the following manner. While the polishing table 3 and the polishing head 1 are rotated in directions indicated by arrows shown in FIG. 1, the polishing liquid is supplied from the polishing-liquid supply nozzle 5 onto the polishing surface 2a of the polishing pad 2 on the polishing table 3. The wafer W is pressed by the polishing head 1 against the polishing surface 2a of the polishing pad 2 in the presence of the polishing liquid between the polishing pad 2 and the wafer W, while the wafer W is rotated by the polishing head 1. The surface of the wafer W is polished by a mechanical action of abrasive particles contained in the polishing liquid and by a chemical action of the polishing liquid.

Every time the polishing table 3 makes one revolution, the film thickness sensor 7 outputs the film-thickness signals relating to a plurality of measurement points on the wafer W, while the film thickness sensor 7 is sweeping across the surface of the wafer W on the polishing pad 2. The processor 9 estimates the film thickness of the wafer W from the film-thickness signal, and controls the polishing operation for the wafer W based on the estimated film thickness. For example, the processor 9 terminates the operation of polishing of the wafer W when the estimated film thickness reaches a target film thickness.

Figure 19A:
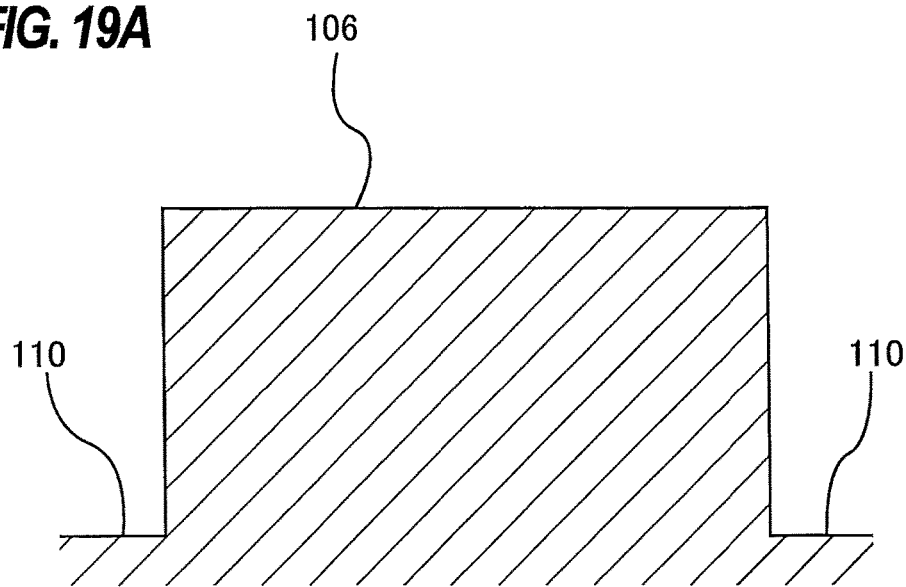
FIG. 19A is a diagram showing a profile (or a cross-sectional shape) of a raised portion at the initial stage of polishing, corresponding to FIG. 18A.

The wafer W as a polishing object is a wafer having a raised portion with a rectangular cross section as shown in FIG. 19A, formed on the wafer surface. In this embodiment, in order to enhance the reliability of film thickness measurement regardless of the difference in the measurement position on the raised portion, a locally-maximum film thickness in the raised portion, i.e., the film thickness at the topmost portion of the raised portion, is determined in the following manner.

Figure 3:
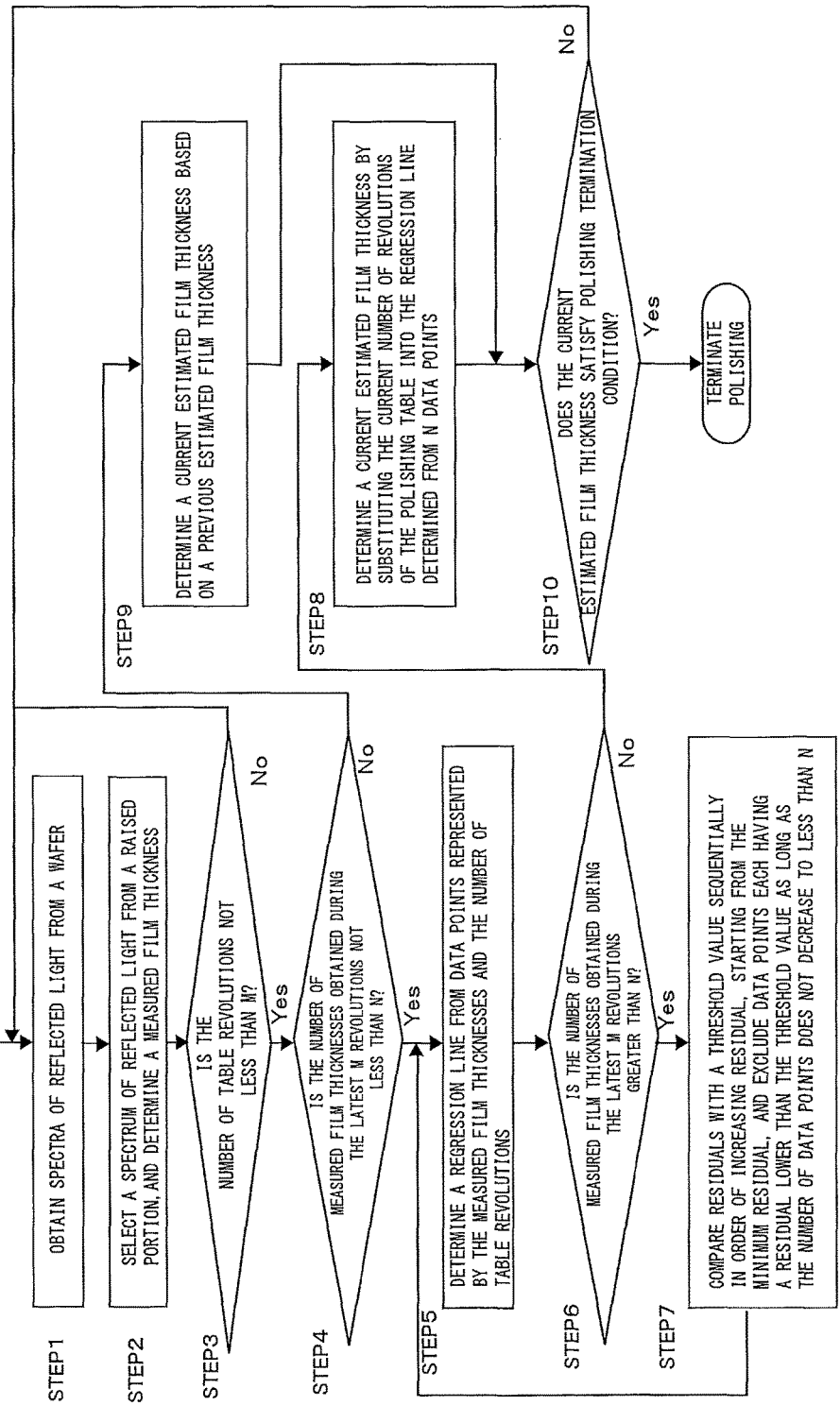
FIG. 3 is a flow chart showing a polishing method according to an embodiment.

FIG. 3 is a flow chart showing a polishing method according to one embodiment. Steps described in this flow chart are performed during one revolution of the polishing table 3. In the embodiments described below, the optical sensor is used as the film thickness sensor 7. In step 1, after polishing of the wafer W is started, the film thickness sensor 7 measures the intensities of the reflected light from the surface of the wafer W at the respective wavelengths of the light, while the polishing table 3 is making one revolution. The processor 9 produces a spectrum from the intensities at the respective wavelengths of the reflected light measured by the film thickness sensor 7. This spectrum indicates a relationship between the intensity of the reflected light and the wavelength, and the shape of the spectrum changes in accordance with the film thickness of the wafer W.

Figure 4:
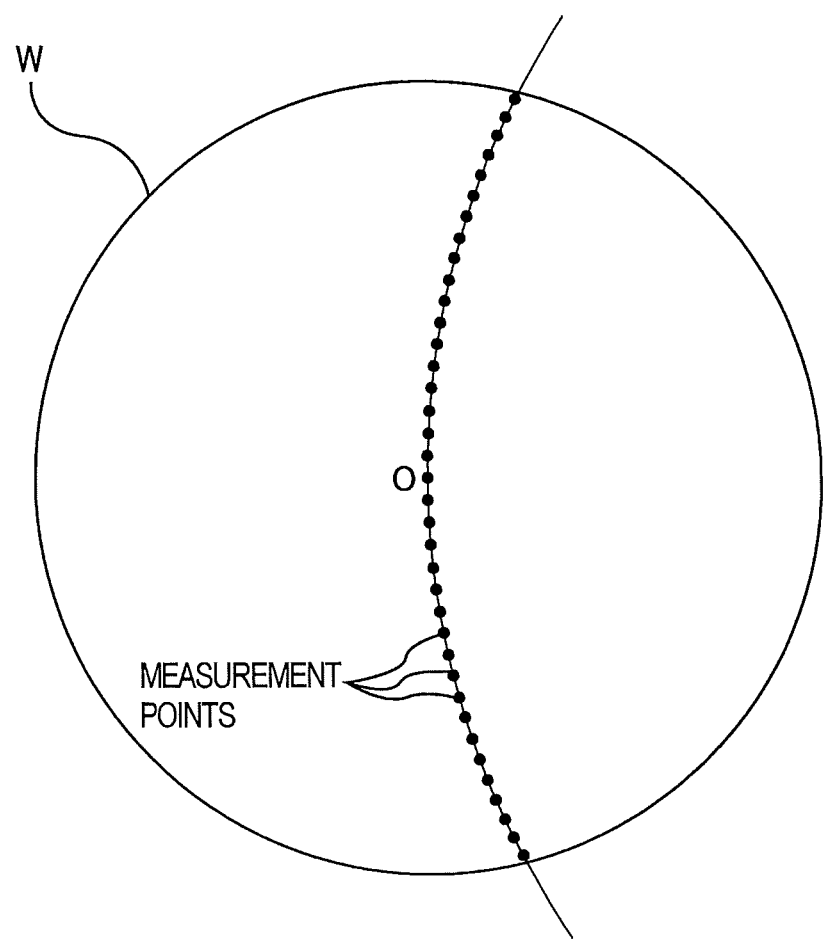
FIG. 4 is a diagram showing an example of measurement points on a wafer surface.

A rotational speed of the polishing table 3 is generally in the range of 30 to 120 $\text{min}^{-1}$, and a measuring cycle of the film thickness sensor 7 is on the order of a few milliseconds. Accordingly, in a case of a wafer having a diameter of 300 mm, several tens to more than 100 spectra are obtained each time the polishing table 3 makes one revolution. FIG. 4 is a diagram showing an example of measurement points on the surface of the wafer W. As shown in FIG. 4, the film thickness sensor 7, while sweeping across the surface of the wafer W, measures the intensities of the reflected light from each one of the measurement points, and the processor 9 produces a spectrum from the measured intensities of the reflected light. The measurement points include a central point of the wafer W.

Figure 5:
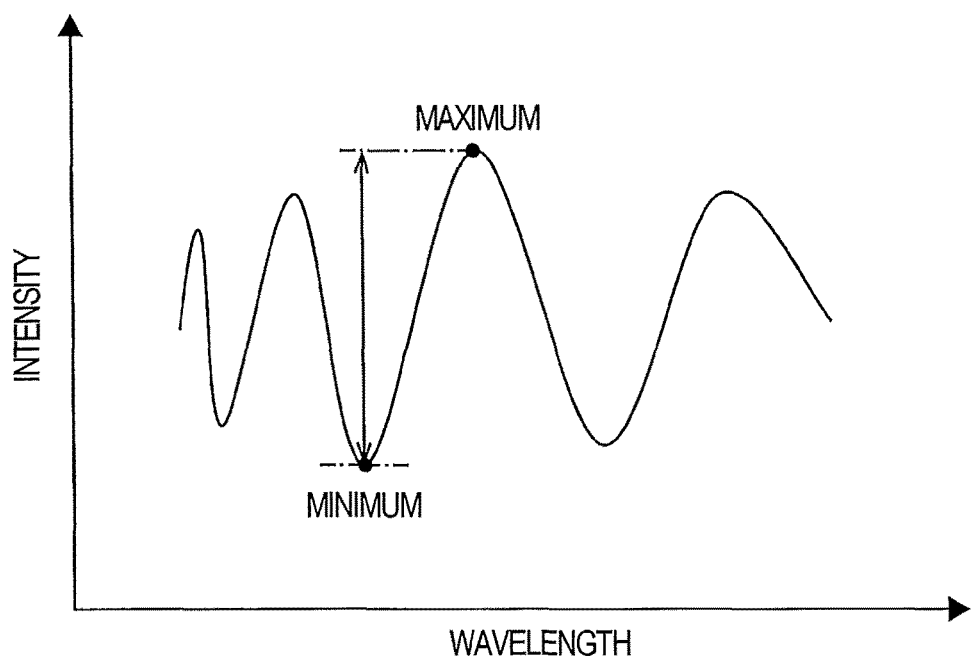
FIG. 5 is a diagram showing an example of a spectrum.

In step 2, a spectrum of light reflected from the raised portion is selected from all the spectra obtained. A method to be used for the selection of spectrum depends on the structure of the raised portion and the structure of other area. In one example, as shown in FIG. 5, a spectrum in which a difference between a maximum intensity and a minimum intensity on that spectrum is not less than a preset value can be selected. The ordinate axis of FIG. 5 represents the intensity of reflected light, which may be expressed in terms of an index value, such as relative reflectance. The relative reflectance is an index value representing the intensity of light, and specifically is a ratio of the intensity of reflected light at a wavelength to a predetermined reference intensity at that wavelength.

Further, a measured film thickness of the raised portion is determined from the thus-selected spectrum. The determination of the measured film thickness is performed by using a known technique. In one example, the determination of measured film thickness is performed by preparing reference data showing relationships between reference spectra and corresponding film thicknesses, determining a reference spectrum which is most similar to the selected spectrum, and determining a film thickness which has been associated in advance with the thus-determined reference spectrum. The reference spectra may be either theoretical spectra obtained by a simulation of light reflection or actually-measured spectra obtained during polishing of a reference wafer having the same specifications as the wafer W. In another example, a film thickness may be calculated by converting the wavelength of a spectrum into the wave number and then applying a Fast Fourier transform to the spectrum.

In step 3, the processor 9 determines whether the number of revolutions of the polishing table 3 after the start of polishing is not less than a predetermined number M. If the latest number of revolutions of the polishing table 3 is less than the predetermined number M, then the process returns to step 1. The film thickness sensor 7 further measures the intensities of reflected light from the wafer W while the polishing table 3 is making the next revolution, and the processor 9 further produces a spectrum from the measured values of the intensities of the reflected light.

If the latest number of revolutions of the polishing table 3 is not less than the predetermined number M, then in step 4 the processor 9 determines whether the number of measured film thicknesses of the raised portion, determined from film-thickness signals obtained at a predetermined measurement area of the wafer surface in a period of time during which the polishing table 3 made the latest M revolutions, is not less than a predetermined number N. The measurement area may be either a single area or a plurality of areas. In the case where a plurality of measurement areas are set, the processing from the step 4 to below-described step 9 is performed for each measurement area. The plurality of measurement areas may preferably be concentric areas that are pre-defined according to the distance (radial position) from the wafer center. The measurement area on the wafer center is a circular area, while the other measurement areas are annular areas each having a certain width. The measurement areas need not necessarily be independent of each other, and two adjacent measurement areas may partly overlap each other.

In step 5, if the number of measured film thicknesses during the latest M revolutions of the polishing table 3 is not less than the predetermined number N, the processor 9 determines a regression line by performing a regression analysis, using a least-square method or the like, on data points which are specified by the measured film thicknesses and the corresponding numbers of revolutions of the polishing table 3. Positions of the data points can be specified on a coordinate system having a vertical axis representing film thickness and a horizontal axis representing the number of revolutions of the polishing table 3. The regression line may be a straight line or, when a temporal change in the film thickness is strongly non-linear, may be a quadratic or cubic polynomial regression line. When the regression line is a straight line, the regression line is expressed as a linear function.

In step 6, the processor 9 determines whether the number of measured film thicknesses, which were used in the determination of the regression line in the step 5, is greater than the predetermined number N. Although not shown diagrammatically, in advance of the step 6, the processor 9 may extrude, as exception points, data points whose residuals are positive and which are far distant from other data points. The residual of a data point herein refers to a distance from the regression line to that data point. The residual is positive when the data point lies above the regression line and is negative when the data point lies below the regression line.

In step 7, if the number of measured film thicknesses is greater than the predetermined number N in the step 6, the processor 9 narrows down the data points. More specifically, a threshold value for exclusion of data is determined by multiplying a predetermined rate F by a maximum residual (positive value) among the residuals of all the data points used in the determination of the regression line. The rate F is higher than −1 and lower than 1 ($-1 < F < 1$). Preferably, the rate F is a value of not less than 0 and less than 1 ($0 \leq F < 1$, e.g., 0.9). If the rate F is set at a value near −1, then no data point is excluded when the maximum residual is larger than the absolute value of the minimum residual. Attention should therefore be paid in this regard. The processor 9 compares the residuals with the threshold value sequentially in the order of increasing residual, starting from the minimum residual, and excludes data points each having a residual lower than the threshold value as long as the number of data points does not decrease to less than the predetermined number N.

Figure 6A:
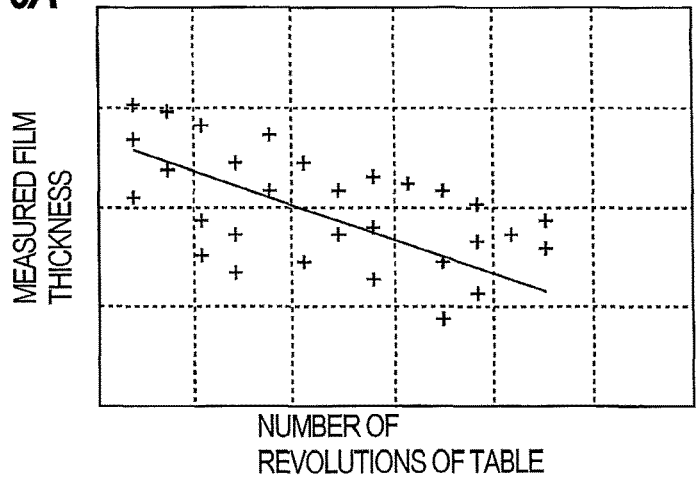
FIG. 6A is a diagram illustrating steps 5 and 6 shown in FIG. 3, and FIGS. 6B and 6C are diagrams illustrating a step 7 shown in FIG. 3.
Figure 6B:
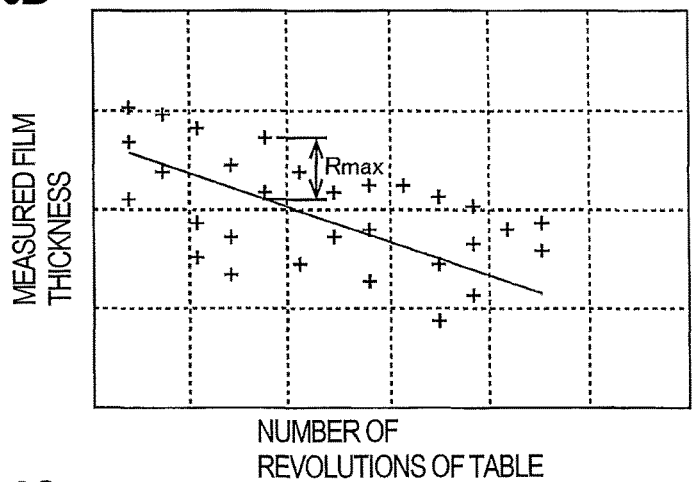
Figure 6C:
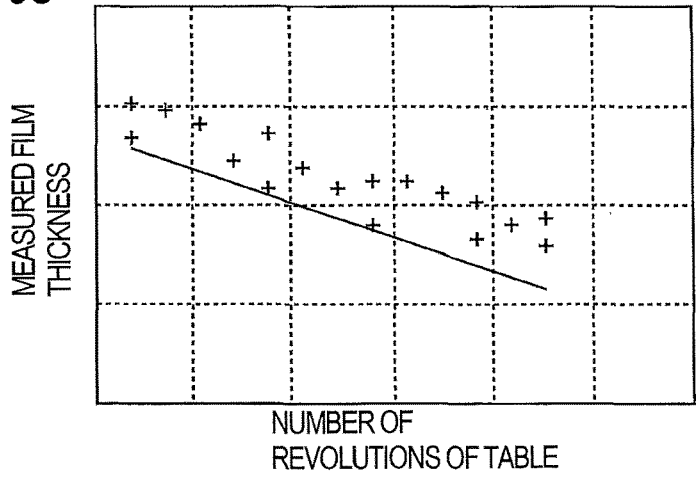

The processing from the step 5 to the step 7 is repeated until the number of data points reaches the predetermined number N. An exemplary operation of repeating the processing from the step 5 to the step 7 will now be described with reference to the drawings. As shown in FIG. 6A, the processor 9 performs the regression analysis on all the data points to determine a regression line (step 5), and determines whether the number of measured film thicknesses, which were used in the determination of the regression line, is greater than the predetermined number N (step 6). If the number of measured film thicknesses is greater than the predetermined number N, the processor 9 determines the threshold value for exclusion of data points by multiplying the predetermined rate F by a residual Rmax having a maximum value (positive value), as shown in FIG. 6B. In this example, the rate F is 0. Therefore, the threshold value is 0. As shown in FIG. 6C, the processor 9 excludes data points each having a residual lower than the threshold value. Since the threshold value is 0 in this example, data points lying below the regression line are deleted (step 7).

Figure 7A:
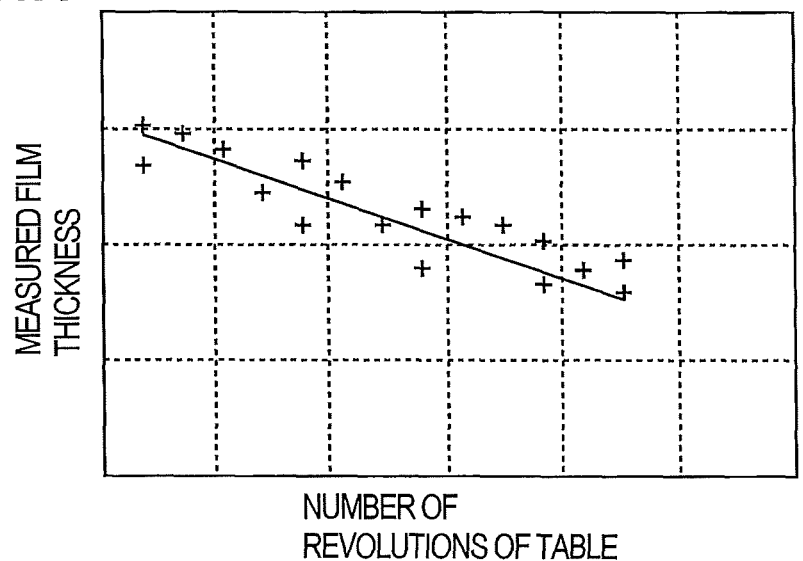
FIG. 7A is a diagram illustrating a regression line obtained by re-performing the step 5.

The processor 9 performs the step 5 again. Specifically, as shown in FIG. 7A, the processor 9 performs the regression analysis again on all the data points, remaining after the deletion of some data points in the step 7, to determine a new regression line. Thereafter, the processor 9 repeats the step 6 and the step 7 in the same manner.

Figure 7B:
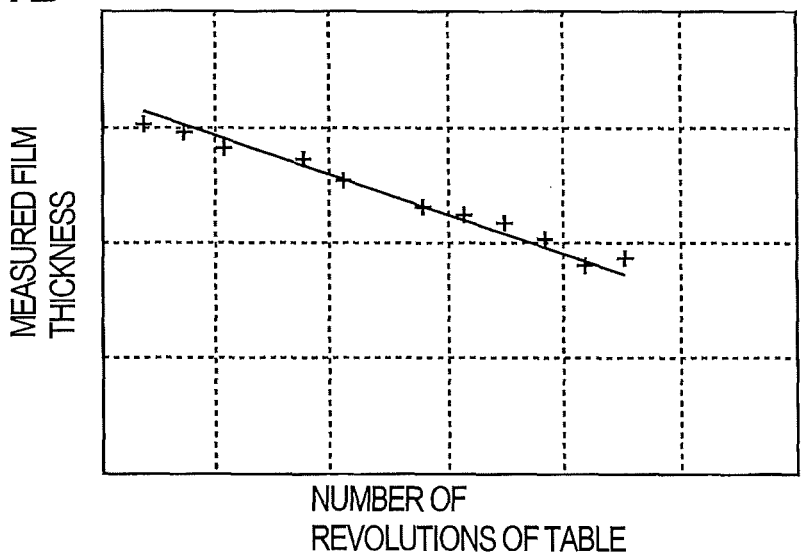
FIG. 7B is a diagram illustrating a regression line finally obtained.

In this manner, the deletion of data points lying below a regression line is repeated, and the operation of redrawing a regression line is repeated. Therefore, as shown in FIG. 7B, the regression line is expected to approach an upper perimeter of the distribution of data points that have been obtained during the latest M revolutions of the polishing table 3. If the rate F is set at a low value, a small number of data points are to be excluded by one operation and the regression line is to be re-drawn more frequently. As a result, a regression line, which coincides with the upper perimeter of the distribution of data points, can be obtained more securely. If the rate F is set at a high value, on the other hand, a final regression line can be reached more quickly.

In step 8, the processor 9 determines a current estimated film thickness in the above-described predetermined measurement area by substituting the current number of revolutions of the polishing table 3 into a function that expresses the regression line determined from the N number of data points in the step 5. The thus-determined estimated film thickness corresponds to the film thickness at the topmost portion of the raised portion of the wafer, i.e., the locally-maximum film thickness.

If in the step 4 the number of measured film thicknesses is less than the predetermined number N, the number of data points is considered insufficient for determining a regression line. A current estimated film thickness may therefore be determined based on a previous estimated film thickness (step 9). For example, the processor 9 may adopt an estimated film thickness, obtained upon the last revolution of the polishing table 3, as a current estimated film thickness. Alternatively, the processor 9 may calculate a current estimated film thickness from a polishing rate (i.e., an amount of film thickness decreased per unit time) which can be calculated from estimated film thicknesses obtained upon the latest several revolutions of the polishing table 3. The estimated film thicknesses determined in the step 8 and the step 9 may be subjected to smoothing processing, such as moving average, in order to reduce minute fluctuation and obtain stable temporal change.

In step 10, the processor 9 determines whether the estimated film thickness determined in the step 8 or the step 9 satisfies a condition for termination of polishing. The processor 9 terminates polishing of the wafer W if the polishing termination condition is satisfied. The polishing termination condition may include, for example, a fact that the estimated film thickness becomes lower than a target film thickness.

In the case where a plurality of measurement areas are set in the surface of the wafer W, in one embodiment the processor 9 may calculate an average of estimated film thicknesses obtained in the plurality of measurement areas, and may determine a polishing end point at which the average becomes lower than a target film thickness. Alternatively, in order to avoid locally-excessive polishing in a particular measurement area, the processor 9 may calculate a minimum value of estimated film thicknesses obtained in the measurement areas, and may determine a polishing end point at which the minimum value becomes lower than a target film thickness. Alternatively, the processor 9 may determine a polishing end point at which, of all the estimated film thicknesses of the measurement areas, estimated film thicknesses in a predetermined number of measurement areas become lower than a target film thickness. In most cases, the same target film thickness is set for the plurality of measurement areas, while it is possible to set individual target film thicknesses for the respective measurement areas.

An estimated film thickness cannot be obtained until the polishing table 3 makes one revolution. Therefore, an actual film thickness may reach a target film thickness after a current estimated film thickness has been obtained and before the next estimated film thickness is obtained. Therefore, in order to improve the precision in the polishing end point detection, the processor 9 may determine a future predicted film thickness by extrapolation based on estimated film thicknesses obtained upon the latest predetermined numbers of revolutions of the polishing table 3, and may determine the polishing end point based on the predicted film thickness. The thus-determined future predicted film thickness is updated when next film-thickness signals are obtained.

If in the step 10 the polishing termination condition is determined to be not satisfied, then polishing conditions may be renewed so that film thicknesses in a plurality of measurement areas become uniform. The polishing conditions to be renewed are preferably the pressures in the pressure chambers (see C1 to C4 of FIG. 2). Basically, at each timing of renewing the polishing conditions, a pressure in the pressure chamber, corresponding to a measurement area where the estimated film thickness is larger than the average, is increased, whereas a pressure in the pressure chamber, corresponding to a measurement area where the estimated film thickness is smaller than the average, is decreased. The renewing of the polishing conditions needs not necessarily be performed every time the polishing table 3 makes one revolution; the timing of the renewing the polishing conditions may be appropriately determined in consideration of a responsiveness of the polishing rate to a change in the polishing conditions. In a case where a plurality of target film thicknesses are set for a plurality of measurement areas of the wafer W, it is possible to control the pressures in the pressure chambers so that a predetermined distribution of the film thicknesses in the measurement areas can be achieved after polishing.

FIG. 8 is a graph showing estimated film thicknesses at the topmost portion of the raised portion, i.e., estimated values of the locally-maximum film thickness, determined by the method shown in FIG. 3. In FIG. 8, a sign + denotes a measured film thickness, and a sign ● denotes an estimated value of the locally-maximum film thickness. Conditions of an experiment shown in FIG. 8 are as follows:

the predetermined number M of revolutions of the polishing table 3=30;

the predetermined number N of measured film thicknesses=8;

the predetermined rate F=0; and the order of regression is 1 (linear regression).

As can be seen in FIG. 8, the estimated values of the locally-maximum film thickness lie approximately on the upper perimeter of the distribution of the data points.

Figure 9:
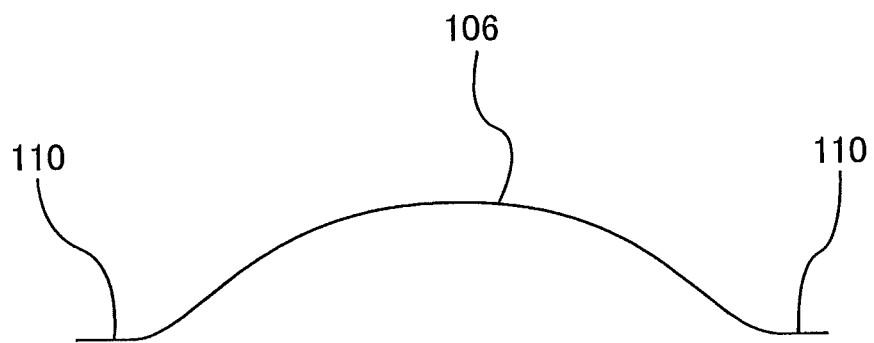
FIG. 9 is a cross-sectional view showing a profile of the raised portion which has become more rounded with the progress of polishing.
Figure 10:
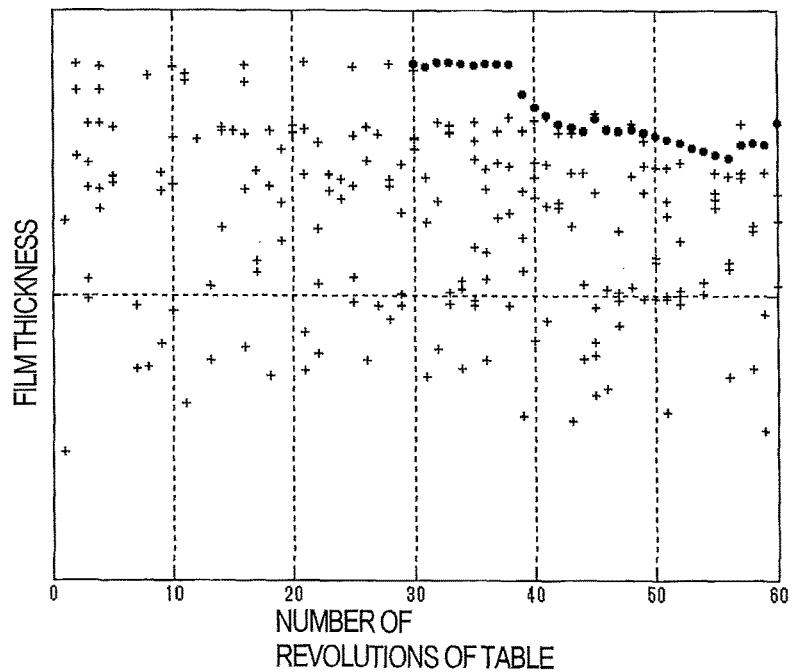
FIG. 10 is a graph showing measured film thicknesses of the raised portion shown in FIG. 9.
Figure 19B:
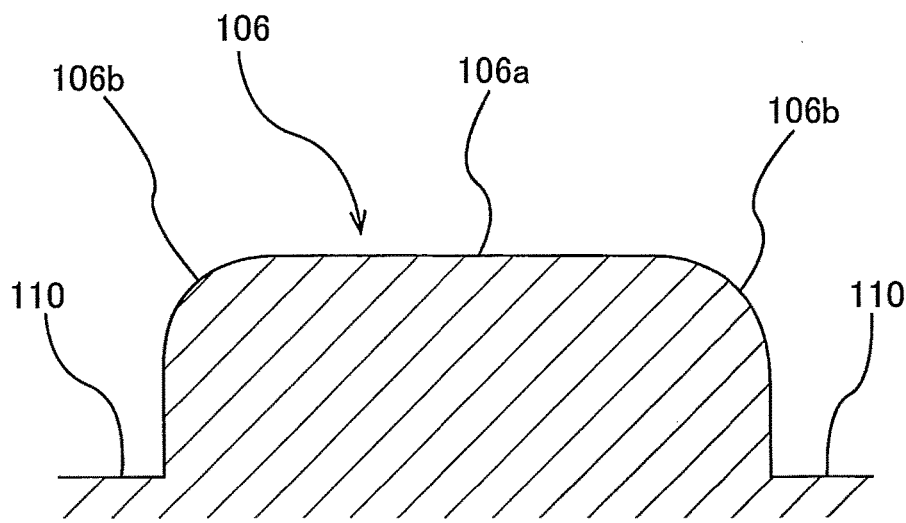
FIG. 19B is a diagram showing a profile (or a cross-sectional shape) of the raised portion at the intermediate stage of polishing, corresponding to FIG. 18B.

The profile of the raised portion 106 shown in FIG. 19B can become further rounded with the progress of polishing, as shown in FIG. 9. In such a case, the variation in the measured film thickness further increases and the data points become sparse at the upper perimeter of the distribution of the data points. As a result, as shown in FIG. 10, the estimated film thickness may become inaccurate or unstable.

Figure 11:
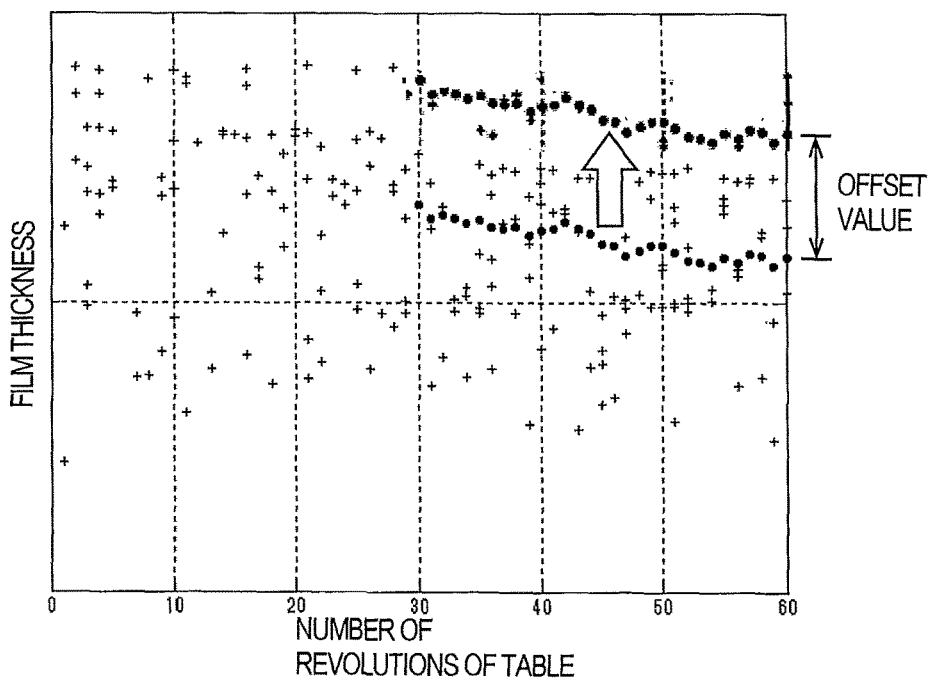
FIG. 11 is a graph illustrating another embodiment for determining an estimated film thickness at a topmost portion of a raised portion, i.e. an estimated value of a locally-maximum film thickness.

In such a case, the predetermined number M, which has been set for the number of revolutions of the polishing table 3, may be increased. Alternatively, in one embodiment, the processor 9 may determine an estimated film thickness at the topmost portion of the raised portion, i.e., an estimated value of the locally-maximum film thickness, by performing a regression analysis on all the data points (all the measured film thicknesses), which have been obtained during the latest predetermined number M of revolutions of the polishing table 3, to thereby determine a regression line, substituting the current number of revolutions of the polishing table 3 into a function that expresses the regression line to thereby calculate an average film thickness and, after performing smoothing processing such as moving average as necessary, adding a predetermined offset value to the calculated average film thickness as shown in FIG. 11. In this embodiment, the processor 9 does not perform the step of determining the threshold value that is obtained by multiplying a residual by the predetermined rate F, and also does not perform the step of excluding data points each having a residual lower than the threshold value.

The offset value is determined based on measured film thicknesses previously obtained during polishing of a wafer having the same specifications and based on a profile of a raised portion of that wafer which was measured when polishing of the wafer was once stopped and the wafer was in a stationary state. The offset value can be defined as a value that changes with polishing time.

Figure 12:
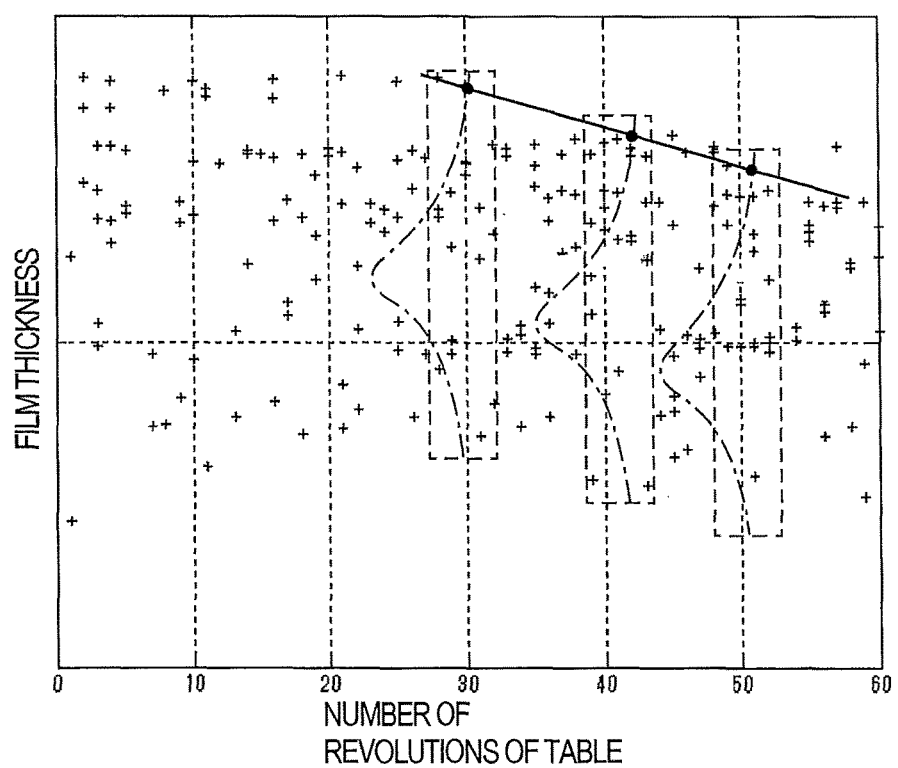
FIG. 12 is a graph illustrating yet another embodiment for determining an estimated film thickness at a topmost portion of a raised portion, i.e. an estimated value of a locally-maximum film thickness.

FIG. 12 is a graph illustrating another embodiment for determining an estimated film thickness at the topmost portion of the raised portion, i.e., an estimated value of the locally-maximum film thickness. In this embodiment, the regression analysis of the data points is not performed. Instead, the processor 9 estimates a probability distribution of film thicknesses (shown by a dashed-dotted line) from data points (data points enclosed by a dotted line) obtained within a predetermined period of time, and determines an estimated film thickness at which the probability of smaller measured film thicknesses is a predetermined value (e.g., 97%).

Figure 13:
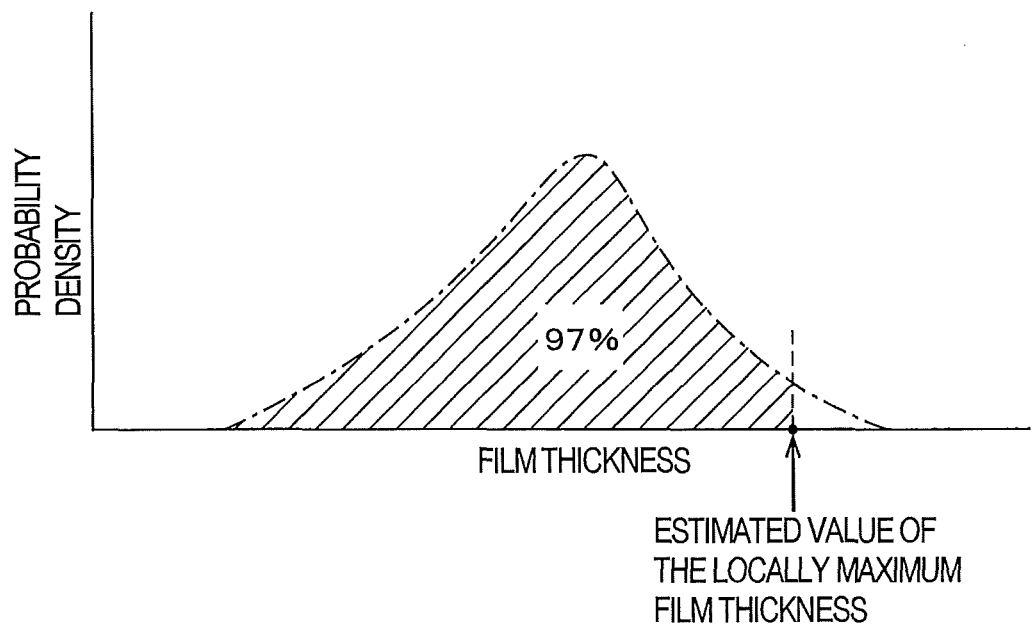
FIG. 13 is a graph showing a probability distribution shown in FIG. 12.

FIG. 13 is a graph showing the probability distribution shown in FIG. 12. In the example shown in FIG. 13, the estimated film thickness to be determined, i.e., an estimated value of the locally-maximum film thickness, is a film thickness at which the probability of smaller measured film thicknesses is 97%. The probability distribution of film thicknesses can be estimated by using a known method, such as Bayesian estimation.

The embodiment shown in FIG. 3 is performed by using the single film thickness sensor 7 installed in the polishing table 3. According to this embodiment, an estimated value of the locally-maximum film thickness can be obtained for each measurement area of the wafer surface each time the polishing table 3 makes one revolution during polishing. However, there has recently been an increasing demand for precision in film thickness of a polished wafer. If polishing of a wafer is terminated based on an estimated film thickness that is obtained in every revolution of the polishing table 3, then the required precision may not be satisfied due to excessive polishing that can occur during one revolution of the polishing table 3. One possible solution is to install more film thickness sensors 7 so as to estimate a film thickness more frequently. This solution, however, leads to a complicated construction of the polishing apparatus, and entails an increased cost.

Figure 14:
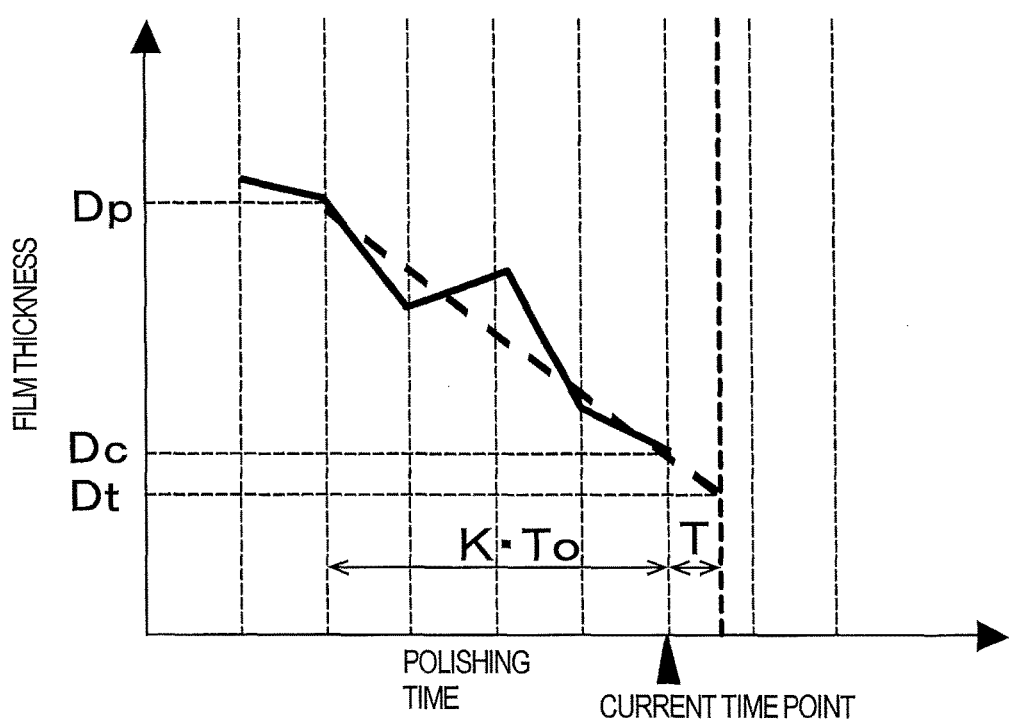
FIG. 14 is a graph illustrating an embodiment in which a predicted film thickness is calculated based on previous polishing data.

Therefore, in one embodiment, the processor 9 predicts a time at which an estimated film thickness reaches a target film thickness each time the polishing table 3 makes one revolution, and terminates polishing of the wafer at the predicted time if the predicted time is before a time at which an estimated film thickness will be obtained during the next revolution of the polishing table 3. For example, a time T required for an estimated film thickness at a current point in time to reach a target film thickness can be determined by the following equation:

$$T=(Dc-Dt)/(Dp-Dc) \times K \cdot To$$

where, as shown in FIG. 14, $Dc$ is an estimated value of the locally-maximum film thickness at a current point in time, K is a predetermined number of revolutions of the polishing table 3, To is a rotation period of the polishing table 3, $Dp$ is an estimated value of the locally-maximum film thickness at a previous point in time from the current point in time by the K revolutions, and $Dt$ is a target film thickness.

Alternatively, following the same way of approach, it is also possible to determine a predicted film thickness D at a time interval which is shorter than the rotation period of the polishing table 3, e.g., at a time interval of ¹/₁₀ of the rotation period, and determine the polishing end point based on the predicted film thickness D. The predicted film thickness D can be determined by the following equation:

$$D=Dc-(Dp-Dc)/(K \cdot To) \times \Delta t$$

where $\Delta t$ is an elapsed time after the current point in time.

According to this embodiment, the substantial resolution of film thickness measurement can be improved, and therefore more precise detection of the polishing end point can be achieved. The end point detection method based on a prediction of film thickness in this embodiment can be applied not only to an estimated value of the locally-maximum film thickness but generally to a measured film thickness as well. Further, the same way of approach can be applied as an alternative to the estimation of film thickness in cases where the estimation becomes difficult in the course of polishing due to the influence of an underlying layer or other causes.

Figure 15:
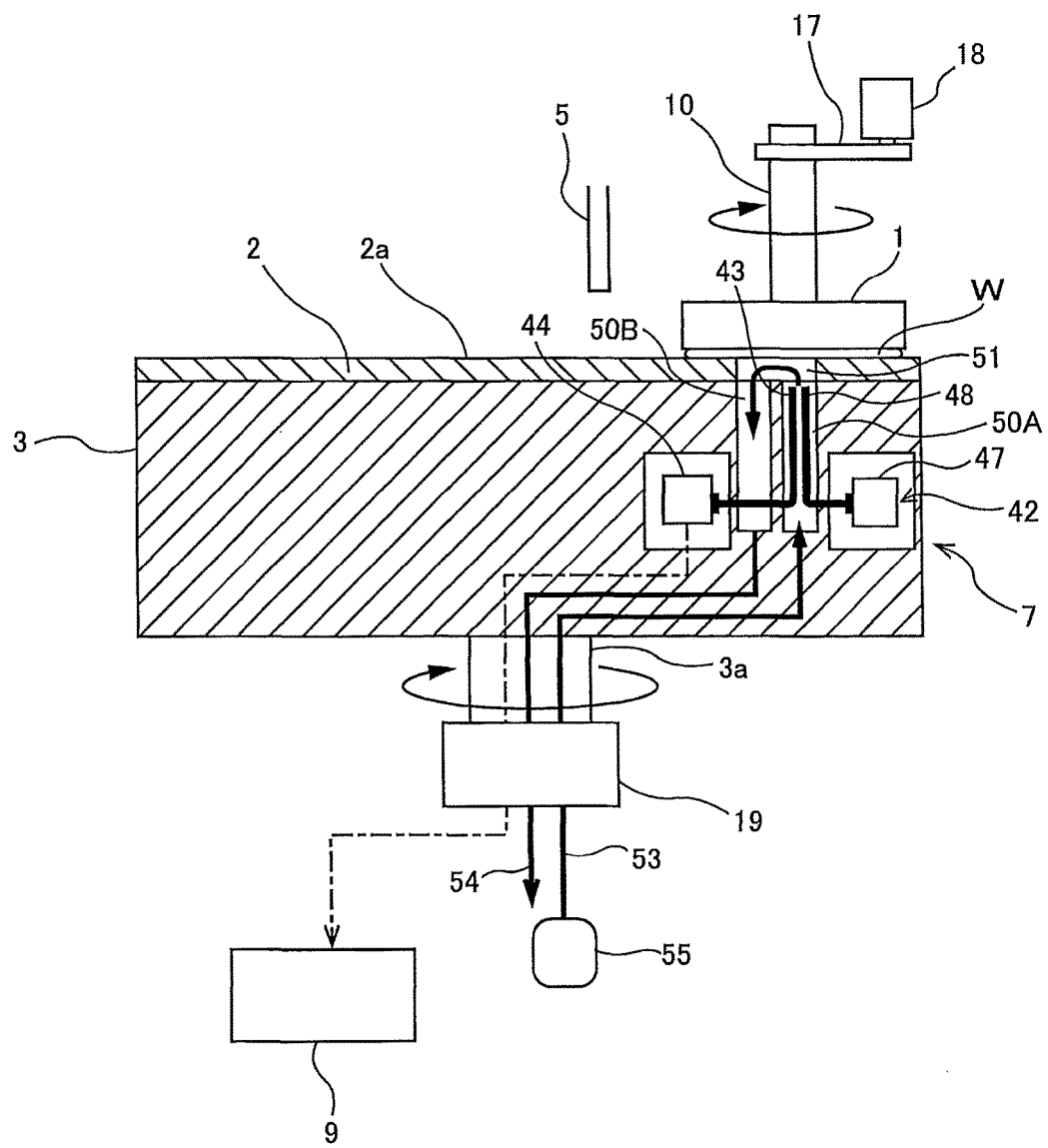
FIG. 15 is a schematic cross-sectional view showing an example of a detailed construction of the polishing apparatus.

Next, an embodiment of the detailed structure of the polishing apparatus using an optical sensor as the film thickness sensor 7 will be described with reference to FIG. 15. FIG. 15 is a schematic cross-sectional view showing an example of the detailed construction of the polishing apparatus. The head shaft 10 is coupled to a polishing head motor 18 through a coupling device 17, such as belt, so that the head shaft 10 is rotated by the polishing head motor 18. This rotation of the head shaft 10 causes the polishing head 1 to rotate in the direction as indicated by arrow.

The film thickness sensor 7 is configured to direct light to the surface of the wafer W, receive the light reflected from the wafer W, and break up the reflected light according to the wavelength. The film thickness sensor 7 includes an illuminator 42 for directing the light to the surface, to be polished, of the wafer W, an optical fiber 43 as a light receiver for receiving the reflected light from the wafer W, and a spectrometer 44 configured to resolve the reflected light according to the wavelength and measure intensity of the reflected light over a predetermined wavelength range.

The polishing table 3 has a first hole 50A and a second hole 50B having upper open ends lying in the upper surface of the polishing table 3. The polishing pad 2 has a through-hole 51 at a position corresponding to the holes 50A and 50B. The holes 50A and 50B are in fluid communication with the through-hole 51, which has an upper open end lying in the polishing surface 2a. The first hole 50A is coupled to a liquid supply source 55 via a liquid supply passage 53 and a rotary joint (not shown). The second hole 50B is coupled to a liquid discharge passage 54.

The illuminator 42 includes a light source 47 for emitting multiwavelength light and an optical fiber 48 coupled to the light source 47. The light source 47 may comprise a pulsed light source, such as xenon flash lamp. The optical fiber 48 is an optical transmission element for transmitting the light, emitted by the light source 47, to the surface of the wafer W. Distal ends of the optical fiber 48 and the optical fiber 43 lie in the first hole 50A and are located near the surface, to be polished, of the wafer W. The distal ends of the optical fiber 48 and the optical fiber 43 are oriented toward the wafer W held by the polishing head 1, so that the light is directed to the multiple measurement points of the wafer W each time the polishing table 3 makes one revolution. Preferably, the distal ends of the optical fiber 48 and the optical fiber 43 are arranged so as to sweep across the center of the wafer W held by the polishing head 1.

During polishing of the wafer W, the liquid supply source 55 supplies water (preferably pure water) as a transparent liquid into the first hole 50A through the liquid supply passage 53. The water fills a space formed between the lower surface of the wafer W and the distal ends of the optical fibers 48, 43. The water further flows into the second hole 50B and is expelled therefrom through the liquid discharge passage 54. The polishing liquid is discharged together with the water and thus a path of light is ensured. The liquid supply passage 53 is provided with a valve (not shown in the drawing) configured to operate in conjunction with the rotation of the polishing table 3. The valve operates so as to stop the flow of the water or reduce the flow of the water when the wafer W is not located over the through-hole 51.

The optical fiber 48 and the optical fiber 43 are arranged in parallel with each other. The distal ends of the optical fiber 48 and the optical fiber 43 are perpendicular to the surface of the wafer W, so that the optical fiber 48 casts the light to the surface of the wafer W perpendicularly.

During polishing of the wafer W, the illuminator 42 directs the light to the wafer W, and the optical fiber (light receiver) 43 receives the light reflected from the wafer W. The spectrometer 44 measures the intensity of the reflected light at each of the wavelengths over the predetermined wavelength range and sends measurement data to the processor 9. This measurement data is the film-thickness signal varying in accordance with the film thickness of the wafer W. The processor 9 produces from the measurement data a spectrum showing the light intensities at the respective wavelengths, and further estimates the film thickness of the wafer W from the spectrum.

Figure 16A:
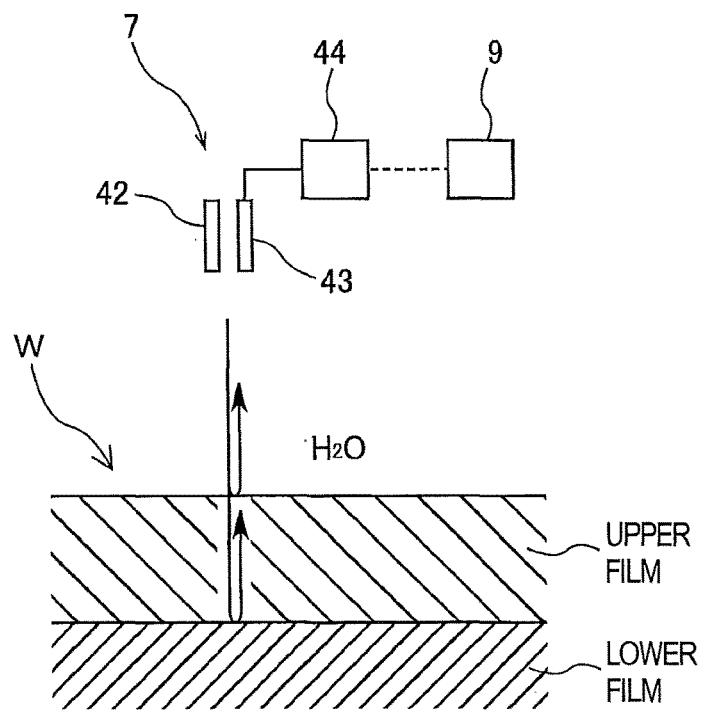
FIG. 16A is a schematic diagram illustrating the principle of film thickness measurement using an optical sensor.
Figure 16B:
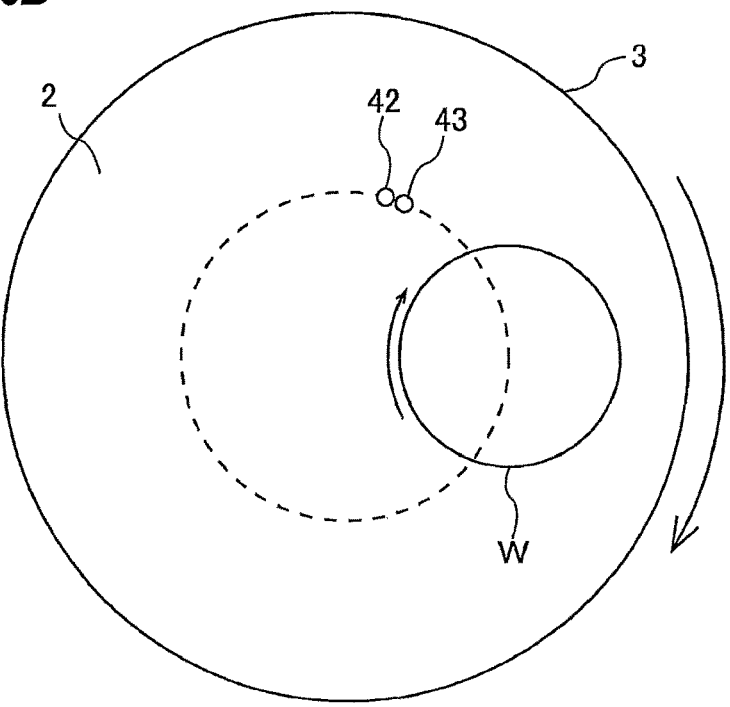
FIG. 16B is a plan view showing a positional relationship between a wafer and a polishing table.

Next, an example of the principle of film thickness measurement using the optical sensor as the film thickness sensor 7 will be described with reference to FIG. 16A and FIG. 16B. FIG. 16A is a schematic diagram illustrating the principle of film thickness measurement using the optical sensor, and FIG. 16B is a plan view showing a positional relationship between the wafer W and the polishing table 3. In this example shown in FIG. 16A, the wafer W has a lower film and an upper film formed on the lower film. The upper film may be a dielectric film that can allow the light to pass therethrough. The illuminator 42 and the light receiver 43 are oriented toward the surface of the wafer W. The illuminator 42 is configured to direct the light to the multiple measurement points, including the center of the wafer W, on the surface of the wafer W each time the polishing table 3 makes one revolution.

The light, directed to the wafer W, is reflected off an interface between a medium (e.g., water in the example of FIG. 16A) and the upper film and an interface between the upper film and the lower film. Light waves from these interfaces interfere with each other. The manner of interference between the light waves varies according to the thickness of the upper film (i.e., a length of an optical path). As a result, the spectrum, produced from the reflected light from the wafer W, varies according to the thickness of the upper film. The spectrometer 44 breaks up the reflected light according to the wavelength and measures the intensity of the reflected light at each of the wavelengths. The processor 9 produces the spectrum from the measurement data of the intensity of the reflected light obtained from the spectrometer 44. The intensity of the light can be expressed as a relative value, such as a reflectance or a relative reflectance.

Figure 17:
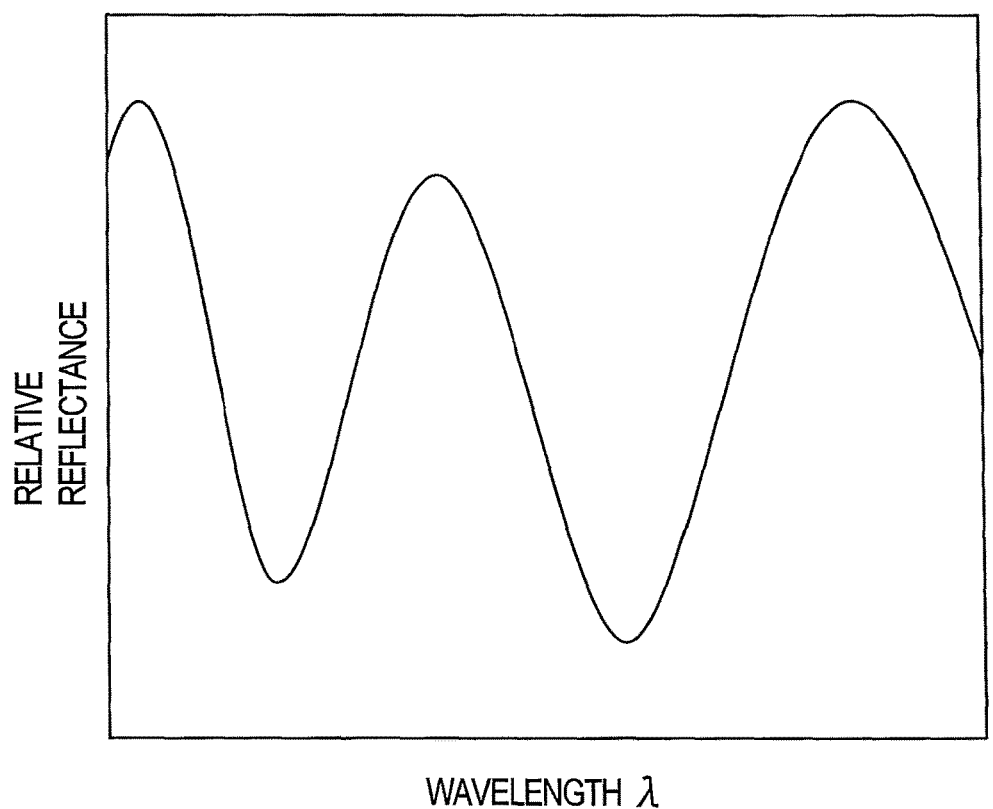
FIG. 17 is a diagram showing an example of a spectrum produced by a processor.
Figure 18A:
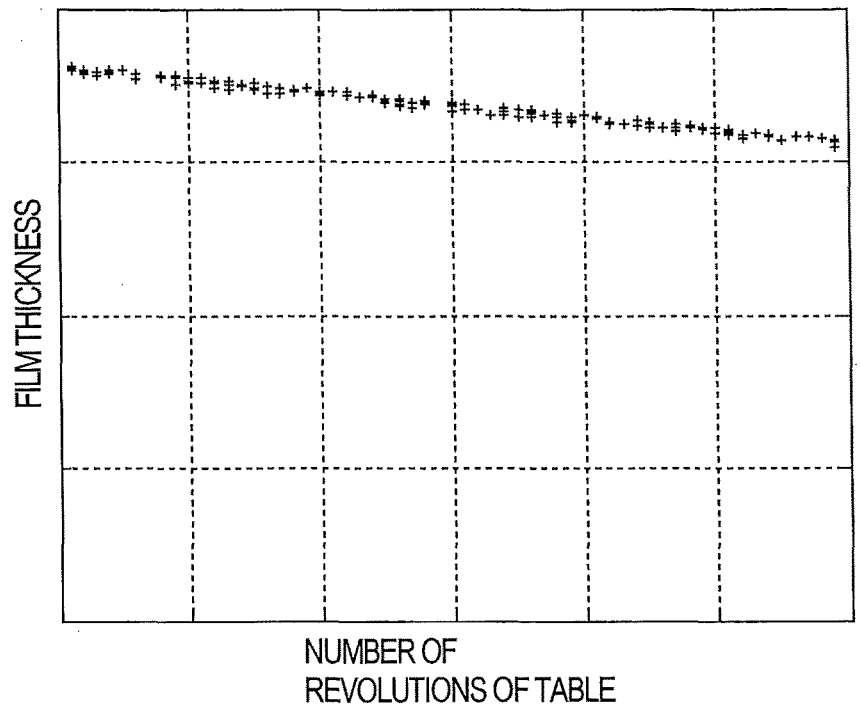
FIG. 18A is a graph showing a change in measured film thickness at an initial stage of polishing.
Figure 18B:
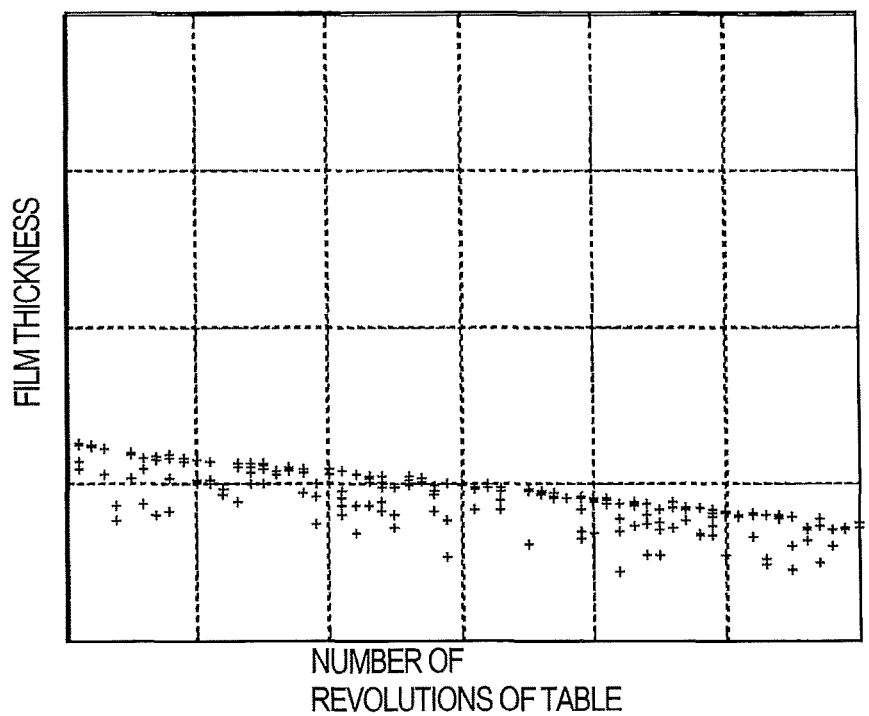
FIG. 18B is a graph showing a change in measured film thickness at an intermediate stage of polishing.

FIG. 17 is a diagram showing an example of the spectrum created by the processor 9. In FIG. 17, horizontal axis represents the wavelength of the reflected light from the wafer, and vertical axis represents relative reflectance derived from the intensity of the reflected light. The relative reflectance is an index that represents the intensity of the reflected light. More specifically, the relative reflectance is a ratio of the intensity of the reflected light to predetermined reference intensity. By dividing the intensity of the light (i.e., the actually measured intensity) by the predetermined reference intensity at each of the wavelengths, unwanted noises, such as a variation in the intensity inherent in an optical system or the light source, are removed from the actually measured intensity. As a result, the spectrum reflecting only the film thickness information can be obtained.

The reference intensity is an intensity that has been obtained in advance at each of the wavelengths. The relative reflectance is calculated for each of the wavelengths. Specifically, the relative reflectance is determined by dividing the intensity of the light (the actually-measured intensity) at each wavelength by a corresponding reference intensity. The reference intensity may be an intensity of the light obtained when a silicon wafer (bare wafer) with no film thereon is being water-polished in the presence of water. In the actual polishing process, a dark level (which is a background intensity obtained under the condition that the light is cut off) is subtracted from the actually measured intensity to determine a corrected actually measured intensity. Further, the dark level is subtracted from the reference intensity to determine a corrected reference intensity. Then the relative reflectance is calculated by dividing the corrected actually measured intensity by the corrected reference intensity. That is, the relative reflectance $R(\lambda)$ can be calculated by using $$R(\lambda) = \frac{E(\lambda) - D(\lambda)}{B(\lambda) - D(\lambda)}$$

where $\lambda$ is wavelength, $E(\lambda)$ is the intensity of the light reflected from the wafer at the wavelength $\lambda$, $B(\lambda)$ is the reference intensity at the wavelength $\lambda$, and $D(\lambda)$ is the background intensity (i.e., dark level) at the wavelength $\lambda$ obtained under the condition that the light is cut off.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A method of polishing a wafer having a raised portion formed on a surface of the wafer, comprising:
    rotating a polishing table that supports a polishing pad;
    pressing the surface of the wafer against the polishing pad;
    obtaining a plurality of film-thickness signals from a film thickness sensor during a latest predetermined number of revolutions of the polishing pad, the film thickness sensor being installed in the polishing table;
    determining a plurality of measured film thicknesses from the plurality of film-thickness signals;
    determining an estimated film thickness at a topmost portion of the raised portion based on the plurality of measured film thicknesses; and
    monitoring polishing of the wafer based on the estimated film thickness at the topmost portion of the raised portion.

2. The method according to claim 1, wherein determining the estimated film thickness at the topmost portion of the raised portion comprises:
    performing a regression analysis on a plurality of data points to determine a regression line, the plurality of data points being specified by the latest plurality of measured film thicknesses and corresponding numbers of revolutions of the polishing table; and
    substituting a current number of revolutions of the polishing table into a function that expresses the regression line to determine the estimated film thickness.

3. The method according to claim 2, wherein determining the estimated film thickness at the topmost portion of the raised portion further comprises:
    excluding at least one of data points which lie below the regression line from the plurality of data points after determining of the regression line; and
    performing a regression analysis on the plurality of data points, from which the at least one data point has been excluded, to determine a new regression line,
    wherein the estimated film thickness is determined by substituting the current number of revolutions of the polishing table into a function that expresses the new regression line.

4. The method according to claim 1, wherein determining the estimated film thickness at the topmost portion of the raised portion comprises:
    performing a regression analysis on a plurality of data points to determine a regression line, the plurality of data points being specified by the latest plurality of measured film thicknesses and corresponding numbers of revolutions of the polishing table; and
    adding a predetermined offset value to a value obtained by substituting a current number of revolutions of the polishing table into a function that expresses the regression line to determine the estimated film thickness.

5. The method according to claim 1, wherein determining the estimated film thickness at the topmost portion of the raised portion comprises:
    producing a probability distribution of the latest plurality of measured film thicknesses; and
    determining the estimated film thickness at which a probability of smaller measured film thicknesses is a predetermined value.

6. The method according to claim 1, wherein the film thickness sensor is an optical sensor having a pulsed light source.

7. The method according to claim 1, wherein the film thickness sensor is an eddy-current sensor.

8. The method according to claim 1, further comprising:
    determining an end point of polishing of the wafer based on the estimated film thickness at the topmost portion of the raised portion.

9. The method according to claim 1, further comprising:
    changing a polishing condition for the wafer based on the estimated film thickness at the topmost portion of the raised portion.

10. The method according to claim 1, further comprising:
    before the film thickness sensor next obtains film-thickness signals, predicting a film thickness at the topmost portion of the raised portion based on a current value and a previous value of the estimated film thickness at the topmost portion of the raised portion; and determining an end point of polishing of the wafer based on the predicted film thickness.

* * * * *